(12) United States Patent
Kando

(10) Patent No.: US 7,456,544 B2
(45) Date of Patent: Nov. 25, 2008

(54) BOUNDARY ACOUSTIC WAVE DEVICE

(75) Inventor: Hajime Kando, Ritto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 11/714,840

(22) Filed: Mar. 7, 2007

(65) Prior Publication Data

US 2007/0159026 A1 Jul. 12, 2007

Related U.S. Application Data

(63) Continuation of application No. PCT/JP2006/305503, filed on Mar. 20, 2006.

(30) Foreign Application Priority Data

May 26, 2005 (JP) ............................. 2005-154250

(51) Int. Cl.
*H03H 9/45* (2006.01)
(52) U.S. Cl. .............................. 310/313 R; 310/313 B; 333/189; 333/195
(58) Field of Classification Search ............. 310/313 A, 310/313 B, 313 C, 313 D, 313 R; 333/189–195
See application file for complete search history.

(56) References Cited

U.S. PATENT DOCUMENTS 5,838,089 A * 11/1998 Dreifus et al. .......... 310/313 A (Continued)

FOREIGN PATENT DOCUMENTS

DE 4132309 4/1993

(Continued)

OTHER PUBLICATIONS

International Search Report from corresponding International application dated Jul. 18, 2006.

(Continued)

*Primary Examiner*—J. A San Martin
(74) *Attorney, Agent, or Firm*—Dickstein Shapiro LLP

(57) ABSTRACT

A boundary acoustic wave device is provided in which an increase in the conductor resistance can be suppressed and a satisfactorily high electromechanical coupling coefficient $K^2$ can be achieved even when the frequency is increased. The boundary acoustic wave device includes a first medium, a second medium, and an IDT provided therebetween. In the boundary acoustic wave device, a plane that separates the IDT into two equal parts in the thickness direction is defined as a boundary plane, the energy of boundary acoustic waves that is present at the first medium side of the boundary plane is represented by E1, and the energy that is present at the second medium side of the boundary plane is represented by E2. Furthermore, under the condition that an IDT including only the conductive layer having the highest density among the plurality of conductive layers constituting the IDT is configured so that the sound velocity of boundary acoustic waves when the IDT includes the plurality of conductive layers is equal to the sound velocity of boundary acoustic waves when the IDT includes only the conductive layer having the highest density, the energy of boundary acoustic waves that is present at the first medium side of the boundary plane is represented by E1' and the energy that is present at the second medium side of the boundary plane is represented by E2'. In this case, the relationship $E1/E2 > E1'/E2'$ is satisfied.

19 Claims, 6 Drawing Sheets

U.S. PATENT DOCUMENTS

| | | | |
|---|---|---|---|
| 5,923,231 A * | 7/1999 | Ohkubo et al. | 333/193 |
| 6,046,656 A * | 4/2000 | Mishima | 333/141 |
| 6,806,795 B2 * | 10/2004 | Shin | 333/193 |
| 7,109,828 B2 * | 9/2006 | Takayama et al. | 333/193 |
| 2005/0099091 A1 * | 5/2005 | Mishima et al. | 310/313 R |

FOREIGN PATENT DOCUMENTS

| | | |
|---|---|---|
| JP | 58-030217 | 2/1983 |
| JP | 2002-26685 | 1/2002 |
| JP | 2005-150915 | 6/2005 |
| WO | WO 98/51011 | 11/1998 |
| WO | WO 98/52279 | 11/1998 |
| WO | WO 2004/070946 | 8/2004 |

OTHER PUBLICATIONS

Written Opinion from corresponding International application dated Jul. 18, 2006.

* cited by examiner

US 7,456,544 B2

BOUNDARY ACOUSTIC WAVE DEVICE

CROSS REFERENCE TO RELATED APPLICATIONS

The present application is a continuation of International Application No. PCT/JP2006/305503, filed Mar. 20, 2006, which claims priority to Japanese Patent Application No. JP2005-154250, filed, May 26, 2005, the entire contents of each of these applications being incorporated herein by reference in their entirety.

FIELD OF THE INVENTION

The present invention relates to a boundary acoustic wave device used as, for example, a resonator or a bandpass filter. More specifically, the present invention relates to a boundary acoustic wave device in which an interdigital transducer (IDT) is disposed between a first medium and a second medium that are composed of different materials.

BACKGROUND OF THE INVENTION

A boundary acoustic wave device has a structure in which an interdigital transducer (IDT) is disposed at the interface between different media. In such a boundary acoustic wave device, boundary acoustic waves propagate in a laminate prepared by laminating the different media. Accordingly, in the boundary acoustic wave device, a complex package structure can be omitted. Therefore, the structure of the boundary acoustic wave device can be simplified and the thickness thereof can be reduced, as compared with a surface acoustic wave device.

In the boundary acoustic wave device, when the operating frequency is increased, the period of an IDT is decreased. Therefore, the width of electrode fingers constituting the IDT and reflectors is decreased. Consequently, the conductor resistance of the electrode fingers is increased, thereby increasing the loss.

On the other hand, in the boundary acoustic wave device, when the sound velocity of boundary acoustic waves is controlled to be lower than the sound velocity of transverse waves propagating through the media disposed on and under the interface, the boundary acoustic waves are confined between the upper and lower media. Accordingly, the propagation loss can be decreased.

In order to increase such a confinement effect, it is effective that the IDT is formed using a metal having a high density. Hitherto, as described in Patent Document 1, the IDT of boundary acoustic wave devices is often composed of Al. In contrast, in the boundary acoustic wave device described in Patent Document 2, in addition to Al, Au and Ag are also disclosed as the IDT material.

Patent Document 1: Japanese Unexamined Patent Application Publication No. 58-30217
Patent Document 2: DE4132309A1

DISCLOSURE OF INVENTION

An operating frequency Fi of an IDT that excites boundary acoustic waves in a boundary acoustic wave device is represented by Fi=V/λi (Equation (a)) wherein V represents the sound velocity of the boundary acoustic waves and λi represents the period of the IDT. As is apparent from Equation (a), when the operating frequency Fi of a boundary acoustic wave device is increased, it is necessary to decrease the period λi of the IDT. Accordingly, the width of electrode fingers constituting the IDT and reflectors is decreased. Consequently, the conductor resistance is disadvantageously increased, thereby increasing the loss. In particular, in the case where the electrode fingers are composed of a conductor having a high density, the propagation loss can be close to zero when the thickness of the electrode fingers is small. However, since the thickness of the electrode fingers is decreased, the conductor resistance is further increased.

SUMMARY OF THE INVENTION

In known techniques, when the IDT of a boundary acoustic wave device is composed of Au, a satisfactorily high electromechanical coupling coefficient $K^2$ cannot be obtained.

It is an object of the present invention to solve the shortcomings of the related art and to provide a boundary acoustic wave device in which boundary acoustic waves can be effectively confined even when the operating frequency is increased, and a high electromechanical coupling coefficient can be obtained, and thus which has a low loss.

According to a first invention of this application, a boundary acoustic wave device includes a first medium composed of a piezoelectric material, a second medium that is laminated on the first medium and that is composed of a dielectric material, and an IDT that is disposed between the first medium and the second medium and that includes a plurality of laminated conductive layers. In the boundary acoustic wave device, the direction in which the first medium and the second medium are laminated is the thickness direction of the IDT, a plane that separates the IDT into two equal parts in the thickness direction is defined as a boundary plane, the energy of boundary acoustic waves that is present at the first medium side of the boundary plane is represented by E1, and the energy that is present at the second medium side of the boundary plane is represented by E2. Furthermore, under the condition that an IDT including only the conductive layer having the highest density among the plurality of conductive layers constituting the IDT is configured so that the sound velocity of boundary acoustic waves when the IDT includes the plurality of conductive layers is equal to the sound velocity of boundary acoustic waves when the IDT includes only the conductive layer having the highest density, the energy of boundary acoustic waves that is present at the first medium side of the boundary plane is represented by E1' and the energy that is present at the second medium side of the boundary plane is represented by E2'. In this case, the relationship E1/E2>E1'/E2' is satisfied.

According to a specific aspect of the first invention, the IDT has a laminated structure including a first conductive layer composed of a metal having a density in the range of 7,000 to 20,000 kg/m³ and a second conductive layer composed of a metal having a density of 1,740 kg/m³ or more and less than 7,000 kg/m³, and a conductive layer of the IDT disposed adjacent to the first medium is composed of the first conductive layer.

According to another specific aspect of the first invention, when the thickness of the first conductive layer is represented by H and the electrode finger period of the IDT is represented by λ, the relationship 0.025λ<H<0.1λ is satisfied.

According to another specific aspect of the first invention, an adhesive layer is provided in at least one of an area where the IDT is in contact with the first medium and an area where the IDT is in contact with the second medium.

According to a second invention, a boundary acoustic wave device includes a first medium composed of a piezoelectric material, a second medium that is composed of a nonconductive material and that is laminated on the first medium, and an IDT disposed between the first medium and the second medium, wherein the IDT has a laminated structure including a first conductive layer composed of a metal having a density in the range of 7,000 to 21,000 kg/m³ and a second conductive layer composed of a metal having a density of 1,740 kg/m³ or more and less than 7,000 kg/m³, and a conductive layer of the IDT disposed adjacent to the first medium is composed of the first conductive layer. In the boundary acoustic wave device, when the thickness of the first conductive layer disposed adjacent to the first medium is represented by H and the electrode finger period of the IDT is represented by λ, the relationship 0.025λ<H<0.1λ is satisfied.

According to a specific aspect of the second invention, an adhesive layer is provided in at least one of an area where the IDT is in contact with the first medium and an area where the IDT is in contact with the second medium.

According to a specific aspect of the present invention, the metal constituting the first conductive layer is one metal selected from the group consisting of Pt, Au, Cu, Ag, Ni, Fe, W, Ta, Cr, and alloys that mainly contain these metals, and the metal constituting the second conductive layer is one metal selected from the group consisting of Mg, Al, Ti, and alloys that mainly contain these metals.

According to another specific aspect of the present invention, the boundary acoustic wave device further includes a reflector that is composed of the same electrode materials as the IDT and that is disposed between the first medium and the second medium.

In the boundary acoustic wave device according to the first invention, an IDT is disposed between a first medium composed of a piezoelectric material and a second substance composed of a nonconductive material, the IDT includes a plurality of laminated conductive layers, and the relationship E1/E2>E1'/E2' is satisfied. Accordingly, boundary acoustic waves propagate while being in a state in which a larger amount of energy is present at the first medium side compared with the second medium side. Therefore, the electromechanical coupling coefficient of the boundary acoustic waves can be increased. In a resonator or a filter having a resonance structure, the applicable range of the passband width can be increased. Furthermore, in a case of a transversal filter, a boundary acoustic wave device with a low loss can be provided.

In the first invention, when the IDT has a laminated structure including the first conductive layer and the second conductive layer, and the first conductive layer composed of a metal having a relatively high density is disposed adjacent to the first medium composed of a piezoelectric material, the energy E1 of boundary acoustic waves that is present at the first medium side can be easily increased to be higher than the energy E2 of boundary acoustic waves that is present at the second medium side. Accordingly, the use of the above electrode laminated structure can easily realize a boundary acoustic wave device that satisfies the relationship E1/E2>E1'/E2'.

In the first invention, when the relationship 0.025λ<H<0.1λ is satisfied, the electromechanical coupling coefficient can be further increased.

When an adhesive layer is provided in at least one of an area where the IDT is in contact with the first medium and an area where the IDT is in contact with the second medium, the adhesiveness between the IDT and the first and/or second medium can be effectively increased.

In the second invention, an IDT is disposed between a first medium composed of a piezoelectric material and a second medium composed of a nonconductive material, the IDT has a laminated structure including a first conductive layer and a second conductive layer that have different densities, and the first conductive layer is disposed adjacent to the first medium. Accordingly, boundary acoustic waves propagate while being in a state in which a larger amount of energy of the boundary acoustic waves is present at the side of the first medium composed of the piezoelectric material. Therefore, the electromechanical coupling coefficient K² can be satisfactorily increased. Furthermore, the relationship 0.025λ<H<0.1λ is satisfied, the electromechanical coupling coefficient K² can be effectively increased.

When an adhesive layer is provided in at least one of an area where the IDT is in contact with the first medium and an area where the IDT is in contact with the second medium, the adhesiveness between the IDT and the first and/or second medium can be effectively increased.

In the present invention, the metals constituting the first and second conductive layers are not particularly limited. However, for example, when the metal constituting the first conductive layer is one metal selected from the group consisting of Pt, Au, Cu, Ag, Ni, Fe, W, Ta, Cr, and alloys that mainly contain these metals and the metal constituting the second conductive layer is one metal selected from the group consisting of Mg, Al, Ti, and alloys that mainly contain these metals, the first and second conductive layers can be easily formed using these general-purpose metals.

In the present invention, when a reflector that is composed of the same electrode materials as the IDT and that is disposed between the first medium and the second medium is further provided, for example, a boundary acoustic wave resonator and a boundary acoustic wave resonator filter that include the reflector can be easily formed in accordance with the present invention.

Figure 1:
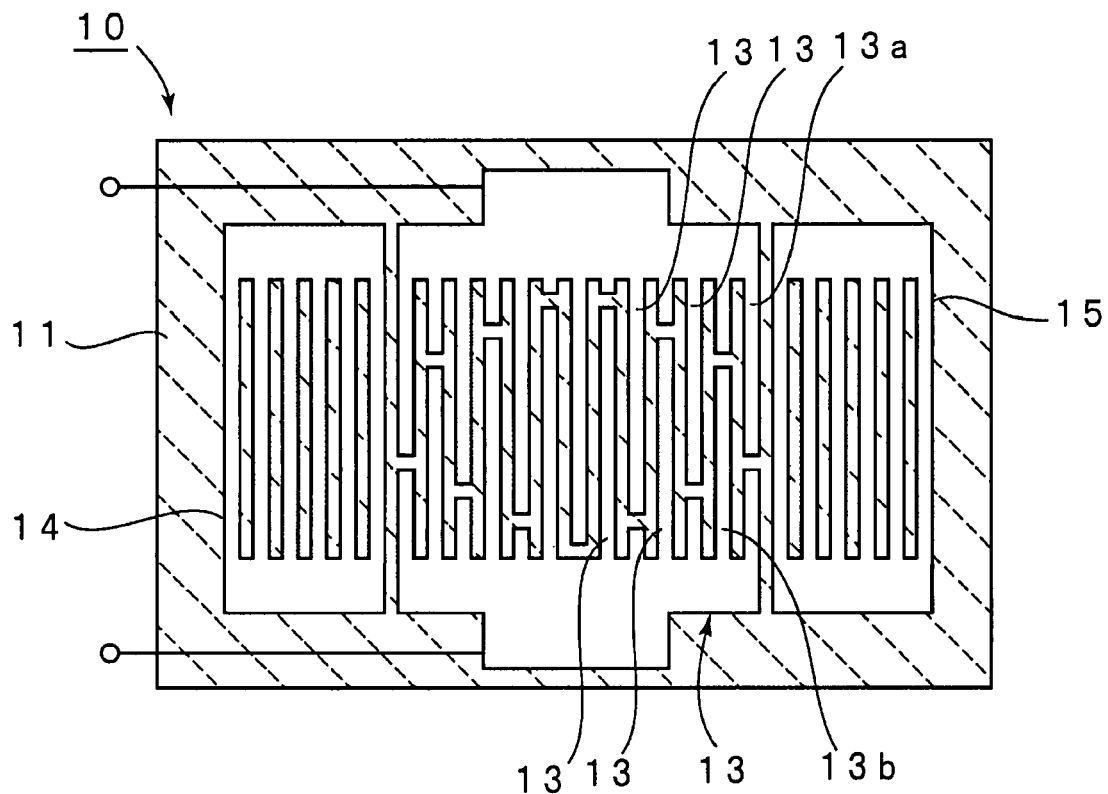
FIG. 1 is a plan cross-sectional view that schematically shows a boundary acoustic wave device according to an embodiment of the present invention.

| Reference Numerals | |
|---|---|
| 10 | boundary acoustic wave device |
| 11 | first medium |
| 12 | second medium |
| 13 | IDT |
| 13a, 13b | electrode finger |
| 14, 15 | reflector |
| 16 | first conductor layer |
| 17 | second conductor layer |

DETAILED DESCRIPTION OF THE INVENTION

The densities, the Euler angles of crystals, and the crystal axes of materials used as a medium or an electrode material in this description are as follows.

Density

Silicon dioxide ($SiO_2$) has a density of 2,210 kg/m$^3$ and an acoustic characteristic impedance of transverse waves of $8.3 \times 10^6$ kg·s/m$^2$. Aluminum (Al) has a density of 2,699 kg/m$^3$ and an acoustic characteristic impedance of transverse waves of $8.4 \times 10^6$ kg·s/m$^2$. Copper (Cu) has a density of 8,939 kg/m$^3$ and an acoustic characteristic impedance of transverse waves of $21.4 \times 10^6$ kg·s/m$^2$. Silver (Ag) has a density of 10,500 kg/m$^3$ and an acoustic characteristic impedance of transverse waves of $18.6 \times 10^6$ kg·s/m$^2$. Gold (Au) has a density of 19,300 kg/m$^3$ and an acoustic characteristic impedance of transverse waves of $24.0 \times 10^6$ kg·s/m$^2$.

Euler Angles

In this description, the right-handed system Euler angle described in a document of "Danseiha Soshi Gijutsu Handobukku (Acoustic Wave Devices Technical Handbook)" (Japan Society for the Promotion of Science, Acoustic wave device technology 150th committee, first printing of the first edition, issued on Nov. 30, 1991, p. 549) was used as the Euler angles ($\phi$, $\theta$, $\psi$) for representing the cut surface of a substrate and the propagation direction of boundary acoustic waves. More specifically, as a crystal axis of LN, for X, Y, and Z, the X-axis was rotated around the Z-axis by $\phi$ counterclockwise to obtain an Xa-axis. Next, the Z-axis was rotated around the Xa-axis by $\theta$ counterclockwise to obtain a Z'-axis. The plane that includes the Xa-axis and that has the Z'-axis as the normal line was the cut surface of the substrate. A direction of axis X' obtained by rotating the Xa-axis around the Z'-axis by $\psi$ counterclockwise was defined as the propagation direction of boundary acoustic waves.

Crystal Axes

The X, Y, and Z axes of the $LiNbO_3$ crystal given as the initial values of the Euler angles are as follows: The Z-axis is parallel to the c-axis, the X-axis is parallel to any one of a-axes that extend in three equivalent directions, and the Y-axis is a direction of the normal line of the plane including the X-axis and the Z-axis.

Equivalent Euler Angles

The Euler angles ($\phi$, $\theta$, $\psi$) of $LiNbO_3$ in the present invention may be crystallographically equivalent. For example, according to a document (Nihon Onkyo Gakkai-shi (Journal of Acoustical Society of Japan), Vol. 36, No. 3, 1980, pp. 140 to 145), $LiNbO_3$ is a crystal belonging to the trigonal system, point group 3m. Accordingly, Equation [4] is satisfied.

$$\begin{aligned} F(\phi, \theta, \psi) &= F(60° - \phi, -\theta, \psi) \\ &= F(60° + \phi, -\theta, 180° - \psi) \\ &= F(\phi, 180° + \theta, 180° - \psi) \\ &= F(\phi, \theta, 180° + \psi) \end{aligned} \quad [4]$$

In the equation, F represents any properties of boundary acoustic waves such as the electromechanical coupling coefficient $k_s^2$, the propagation loss, the temperature coefficient of frequency (TCF), the power flow angle (PFA), and the natural unidirectionality. Although the sign of the natural unidirectionality of the PFA changes when, for example, the plus and minus of the propagation direction are reversed, the absolute values remain unchanged. Therefore, these are considered to be equivalent. Although Document 7 relates to surface acoustic waves, the crystal symmetry can be similarly handled in the case of boundary acoustic waves.

For example, the boundary acoustic wave propagation property at Euler angles (30°, $\theta$, $\psi$) is equivalent to the boundary acoustic wave propagation property at Euler angles (90°, 180°−$\theta$, 180°−$\psi$). Also, for example, the boundary acoustic wave propagation property at Euler angles (30°, 90°, 45°) is equivalent to the boundary acoustic wave propagation properties at Euler angles shown in the table below.

The material constants of the conductors used in the calculations in the present invention are values of polycrystals thereof. However, in crystals such as an epitaxial film, the crystal orientation dependency of a substrate is dominant over the crystal orientation dependency of the film itself in regard to the properties of boundary acoustic waves. Therefore, the equivalent propagation properties of boundary acoustic waves can be obtained to the extent that does not cause practical problems in accordance with Equation [4].

TABLE 1

| φ (°) | θ (°) | ψ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |
| 330 | 90 | 135 |
| 330 | 90 | 315 |
| 330 | 270 | 45 |
| 330 | 270 | 225 |

The present invention will now be clarified by describing specific embodiments of the present invention with reference to the drawings.

Figure 2:
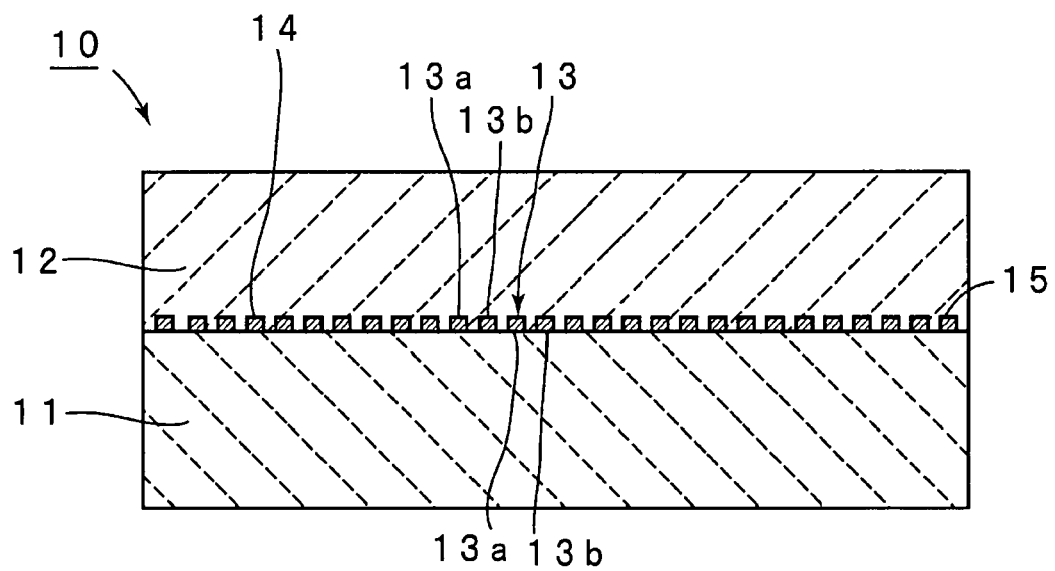
FIG. 2 is a front cross-sectional view that schematically shows the boundary acoustic wave device according to the embodiment of the present invention.

FIGS. 1 and 2 are a plan cross-sectional view and a front cross-sectional view, respectively, that schematically show a boundary acoustic wave device according to an embodiment of the present invention.

A boundary acoustic wave device 10 is composed of a laminate prepared by laminating a first medium 11 and a second medium 12. In this embodiment, the first medium 11 is composed of a 15° Y-cut X-propagation ((0°, 105°, 0°) in terms of the Euler angles) LiNbO$_3$ plate, which is a piezoelectric material.

In this embodiment, the second medium 12 is composed of SiO$_2$, which is a nonconductive material.

An IDT 13 and reflectors 14 and 15 are disposed at the interface between the first medium 11 and the second medium 12. In the IDT 13, a plurality of electrode fingers 13a and a plurality of electrode fingers 13b are disposed so as to be interdigitated with each other. The plurality of electrode fingers 13a are electrically connected to one busbar, and the plurality of electrode fingers 13b are electrically connected to another busbar.

In this embodiment, the IDT 13 and the reflectors 14 and 15 have a laminated structure including a first conductive layer composed of Au having a relatively high density and a second conductive layer composed of Al having a relatively low density.

Figure 3:
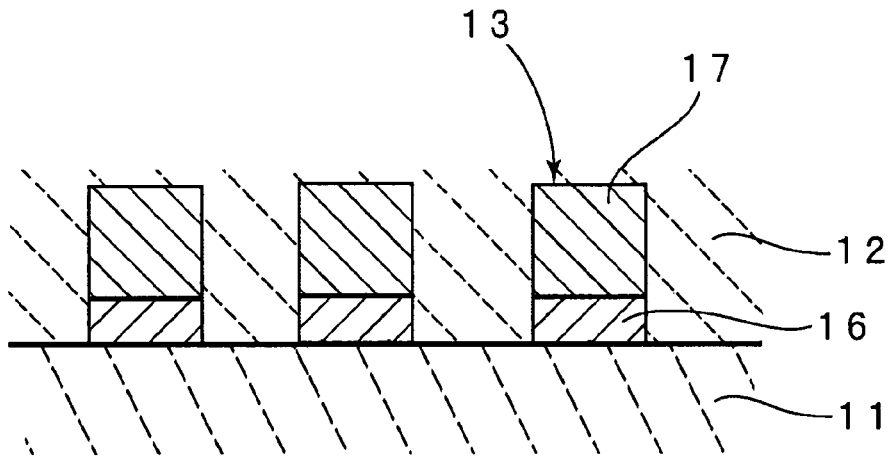
FIG. 3 is a schematic, partially enlarged front cross-sectional view showing an electrode structure of the boundary acoustic wave device according to the embodiment of the present invention.

FIG. 3(a) is a schematic enlarged cross-sectional view illustrating the transverse cross-sectional structure of the electrode fingers 13a and 13b. The electrode fingers 13a and 13b have a structure in which a first conductive layer 16 and a second conductive layer 17 are laminated. The first conductive layer 16 is composed of Au and is disposed adjacent to the first medium 11 composed of a piezoelectric material. The second conductive layer 17 is composed of Al and is disposed adjacent to the second medium 12 composed of a nonconductive layer.

The reflectors 14 and 15 also have the same electrode structure as that of the IDT 13. That is, the reflectors 14 and 15 also have the structure in which the first conductive layer 16 and the second conductive layer 17 are laminated.

In the boundary acoustic wave device 10 of this embodiment, since the first medium 11 and the second medium 12 are formed as described above and the IDT 13 and the reflectors 14 and 15 have the above electrode structure, a satisfactorily high electromechanical coupling coefficient of boundary acoustic waves can be obtained. Here, a plane that separates the IDT 13 into two equal parts in the thickness direction is defined as a boundary plane. In this case, the energy of boundary acoustic waves that is present at the first medium 11 side of the boundary plane is represented by E1, and the energy of boundary acoustic waves that is present at the second medium side of the boundary plane is represented by E2. Furthermore, under a condition that the sound velocity of boundary acoustic waves when the IDT includes only the conductive layer having the highest density among the plurality of conductive layers constituting the IDT is equal to the sound velocity of boundary acoustic waves when the IDT includes the plurality of conductive layers, the energy of boundary acoustic waves that is present at the first medium side of the boundary plane is represented by E1' and the energy of boundary acoustic waves that is present at the second medium side of the boundary plane is represented by E2'. In the above case, the relationship E1/E2>E1'/E2' is satisfied. Accordingly, the electromechanical coupling coefficient K$^2$ of the boundary acoustic wave device 10 is improved. In a resonator or a filter having a resonance structure, the applicable range of the passband width can be increased. Furthermore, in a transversal filter, the loss can be decreased. A specific description regarding this is set forth herein.

The relationships between the thickness of the Al second conductive layer and the sound velocity of boundary acoustic waves, between the thickness of the Al second conductive layer and the electromechanical coupling coefficient K$^2$, and between the thickness of the Al second conductive layer and the temperature coefficient of delay time TCD were determined in the case where the boundary acoustic wave device 10 was experimentally produced under the following conditions.

Prerequisite Conditions

Laminated structure: SiO$_2$/IDT/LiNbO$_3$

IDT: The first conductive layer was composed of Au and the thickness thereof was 0.05λ or variable. The second conductive layer 17 was composed of Al and the thickness thereof was 0.1λ or variable.

The thicknesses of the first medium 11 and the second medium 12 were taken as infinity.

Figure 4:
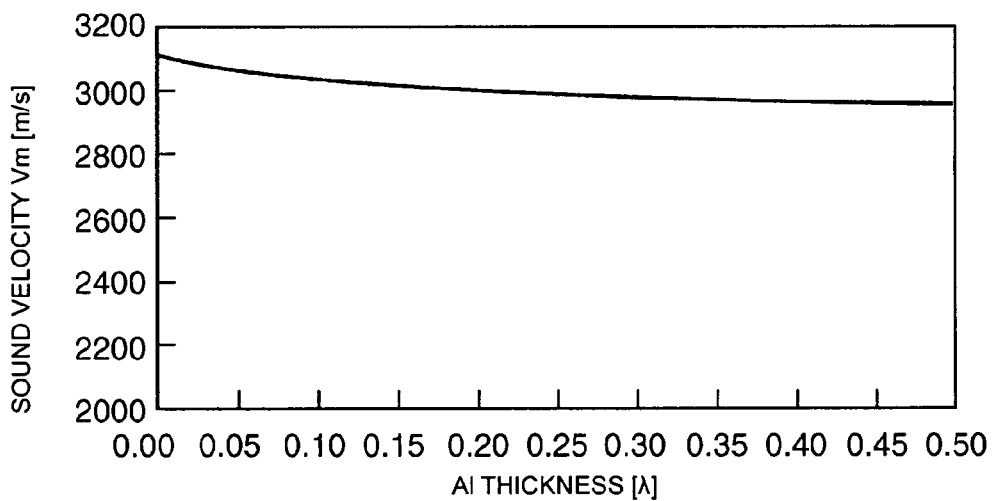
FIG. 4 is a graph showing a change in the sound velocity Vm of boundary acoustic waves in the boundary acoustic wave device shown in FIG. 1 in the case where a first conductor layer composed of Au is disposed adjacent to a first medium, and the thickness of Al constituting a second conductor layer is changed.
Figure 5:
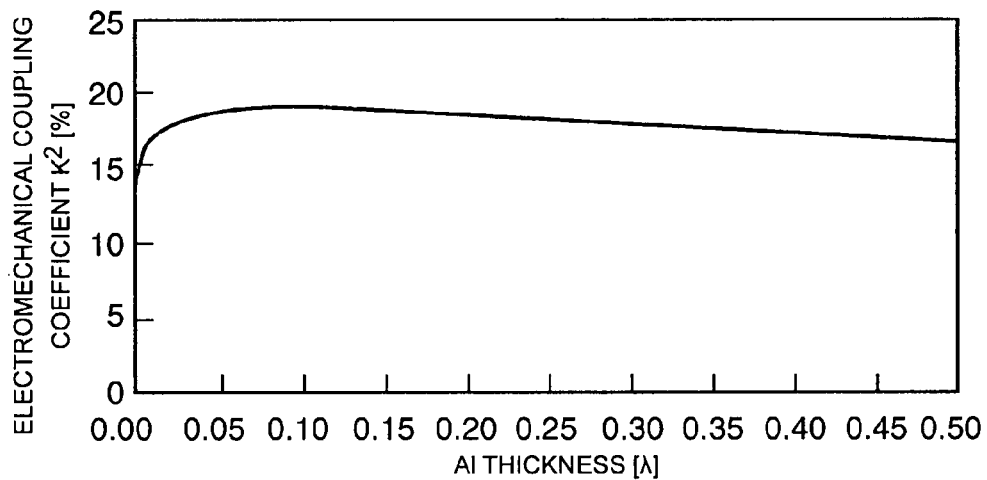
FIG. 5 is a graph showing a change in the electromechanical coupling coefficient K² of boundary acoustic waves in the boundary acoustic wave device shown in FIG. 1 in the case where the first conductor layer composed of Au is disposed adjacent to the first medium, and the thickness of Al constituting the second conductor layer is changed.
Figure 6:
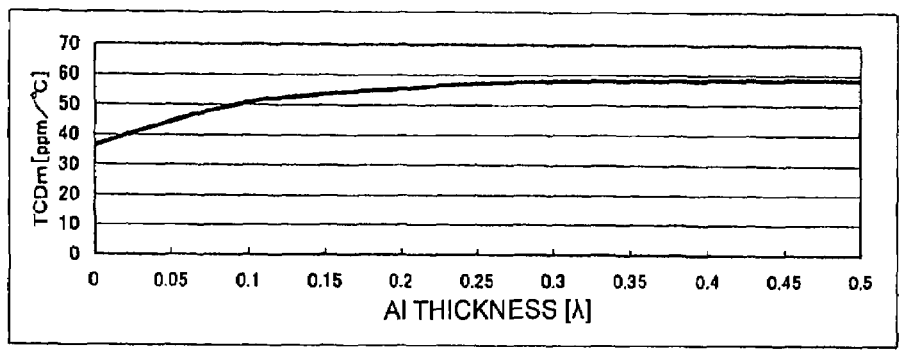
FIG. 6 is a graph showing a change in the temperature coefficient of delay time TCD of boundary acoustic waves in the boundary acoustic wave device shown in FIG. 1 in the case where the first conductor layer composed of Au is disposed adjacent to the first medium, and the thickness of Al constituting the second conductor layer is changed.

Under the above conditions, the thickness of the first conductive layer 16 composed of Au was 0.05λ, and the thickness of Al constituting the second conductive layer 17 was varied. The relationships between the Al thickness and the sound velocity of boundary acoustic waves, between the Al thickness and the electromechanical coupling coefficient, and between the Al thickness and the temperature coefficient of delay time TCD were determined for boundary acoustic waves mainly composed of an SH component under the above conditions. The results are shown in FIGS. 4 to 6, respectively.

Figure 7:
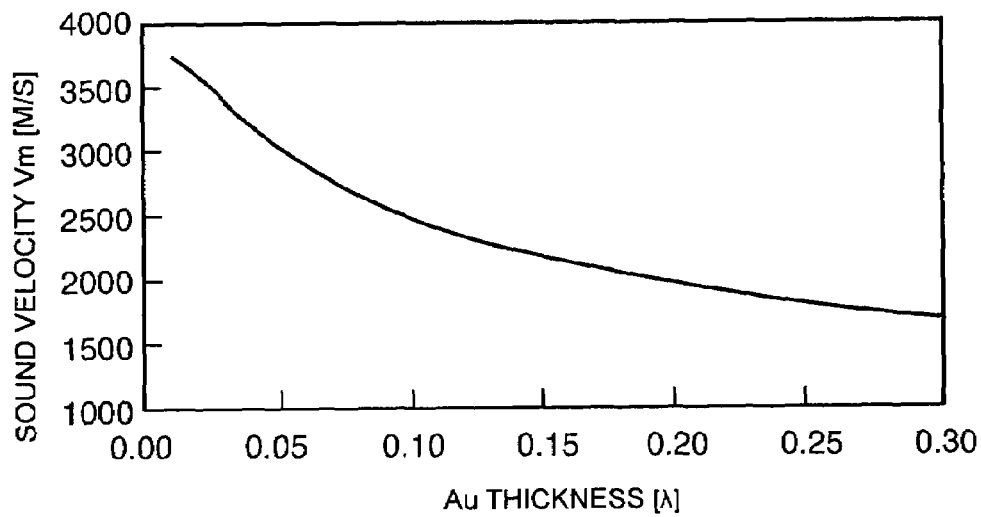
FIG. 7 is a graph showing a change in the sound velocity Vm of boundary acoustic waves in the boundary acoustic wave device shown in FIG. 1 in the case where the thickness of the second conductor layer is constant and the thickness of Au constituting the first conductor layer disposed adjacent to the first medium composed of a piezoelectric material is changed.
Figure 8:
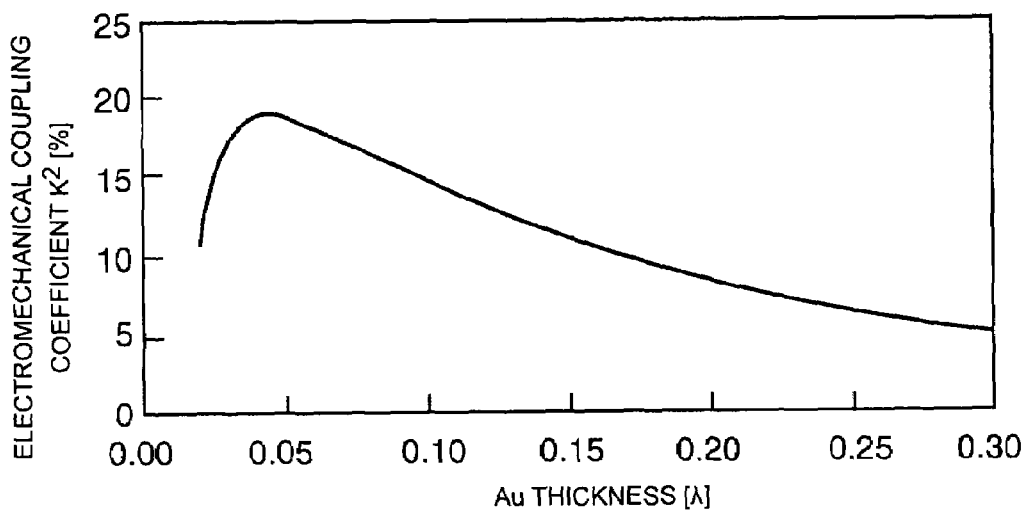
FIG. 8 is a graph showing a change in the electromechanical coupling coefficient $K^2$ of boundary acoustic waves in the boundary acoustic wave device shown in FIG. 1 in the case where the thickness of the second conductor layer is constant and the thickness of Au constituting the first conductor layer disposed adjacent to the first medium composed of a piezoelectric material is changed.
Figure 9:
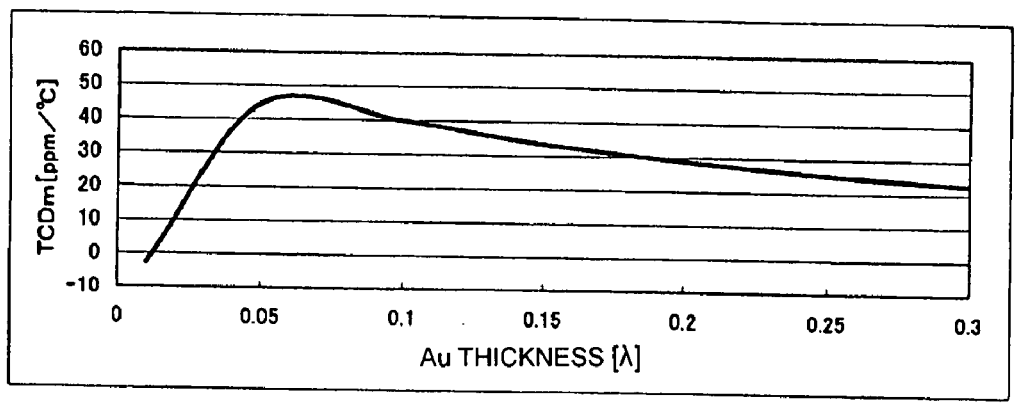
FIG. 9 is a graph showing a change in the temperature coefficient of delay time TCD of boundary acoustic waves in the boundary acoustic wave device shown in FIG. 1 in the case where the thickness of the second conductor layer is constant and the thickness of Au constituting the first conductor layer disposed adjacent to the first medium composed of a piezoelectric material is changed.

In addition, under the above conditions, the thickness of Al serving as the second conductive layer 17 was 0.1λ, and the thickness of the first conductive layer 16 composed of Au was varied. Similarly, the relationships between the Au thickness (λ) and the sound velocity of boundary acoustic waves mainly composed of an SH component, between the Au thickness (λ) and the electromechanical coupling coefficient K$^2$, and between the Au thickness (λ) and the temperature coefficient of delay time TCD were determined. The results are shown in FIGS. 7 to 9, respectively. In FIGS. 4 to 6, the results in the case where Al thickness=0 corresponded to the results in the case where an electrode composed of only Au was used.

In all the cases, the propagation loss was zero. When the thickness of the Al film was varied, the propagation loss was approximately zero regardless of the thickness of the Al film. When the thickness of the Au film was varied, the propagation loss was also approximately zero regardless of the thickness of the Au film.

The above results were determined on the basis of a document "A method for estimating optimal cuts and propagation directions for excitation and propagation directions for excitation of piezoelectric surface waves" (J. J. Campbell and W. R. Jones, IEEE Trans. Sonics and Ultrason., Vol. SU-15 (1968) pp. 209 to 217). In the case of an open boundary, the sound velocity was determined under the following conditions: The normal components of the displacement, the electrical potential, the electric flux, and the density and the stress in the vertical direction are continuous at the boundary between the first medium 11 and the second medium 12, the boundary between the first medium 11 and the IDT 13, and the boundary between the IDT 13 and the second medium 12. The thickness of the first medium 11 and the thickness of the second medium 12 were taken as infinity. The relative dielectric constant of conductors constituting the IDT and the like was 1. In the case of a short-circuit boundary, the sound velocity was determined under the condition that the electrical potentials at the boundary between the second medium and the IDT and at the boundary between the IDT and the first medium were zero. The electromechanical coupling coefficient $K^2$ was calculated using Equation (1). In Equation (1), Vf represents the sound velocity at an open boundary.

$$K^2 = 2 \times |Vf - V|/Vf \qquad \text{Equation (1)}$$

The temperature coefficient of delay time TCD was calculated using Equation (2) on the basis of phase velocities V at 20° C., 25° C., and 30° C.

$$TCD = (V[20°C.] - V[30°C.])/V[25°C.]/10 + \alpha s \qquad \text{Equation (2)}$$

In Equation (2), αs represents a coefficient of linear expansion of the first medium 11 in the propagation direction of boundary waves.

As is apparent from FIG. 5, by laminating the second conductive layer 17 composed of Al, that is, by increasing the thickness of Al to larger than zero, the electromechanical coupling coefficient $K^2$ can be increased.

On the other hand, as is apparent from FIG. 8, in the structure in which the first conductive layer 16 and the second conductive layer 17 are laminated, when the thickness of Au, which is the first conductive layer 16, is in the range of 0.025λ to 0.1λ, the electromechanical coupling coefficient $K^2$ can be increased compared with a corresponding boundary acoustic wave device including an electrode composed of only Au.

Accordingly, referring to FIGS. 4 to 9, when the first conductive layer 16 and the second conductive layer 17 are composed of Au and Al, respectively, the thickness of the first conductive layer 16 composed of Au is preferably in the range of 0.025λ to 0.1λ.

Figure 10:
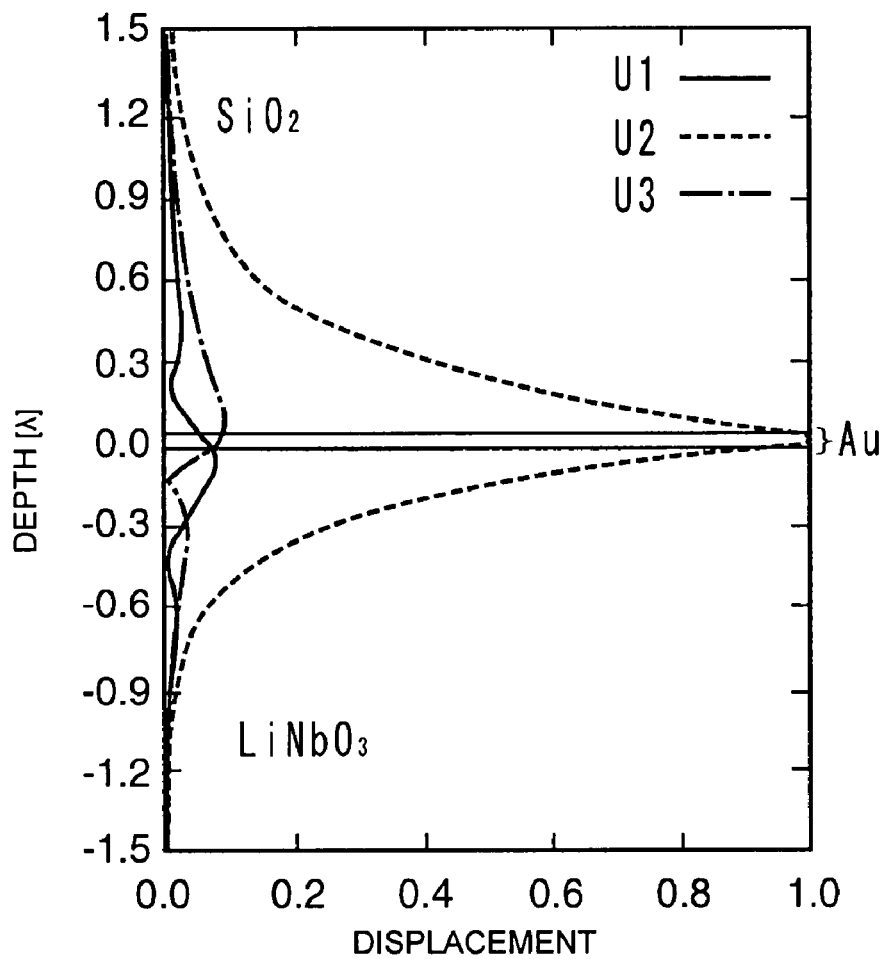
FIG. 10 is a graph that schematically shows a displacement distribution of boundary acoustic waves in a comparative boundary acoustic wave device including an IDT composed of only Au.
Figure 11:
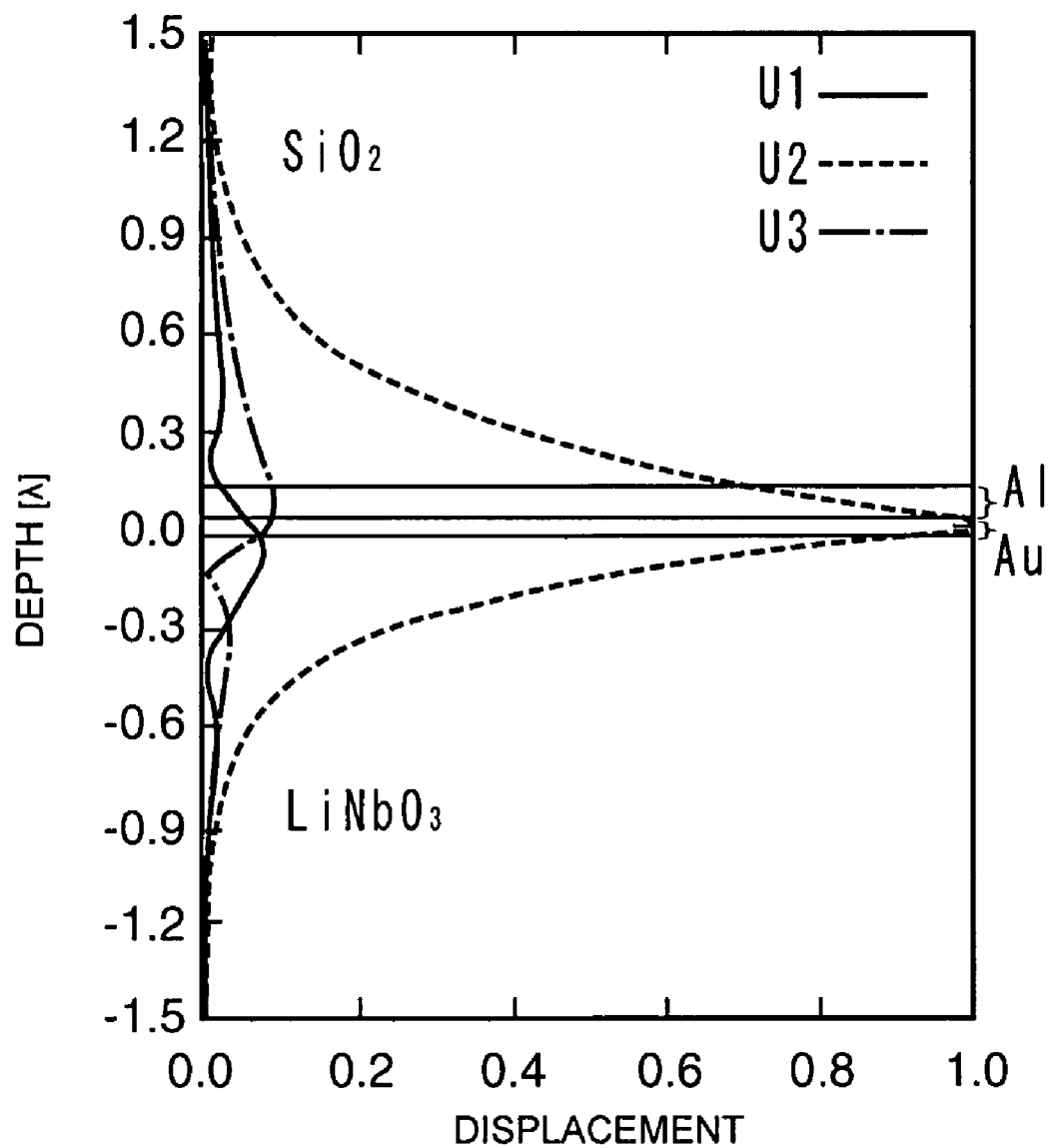
FIG. 11 is a graph showing a displacement distribution of boundary acoustic waves in a boundary acoustic wave device of an embodiment in which a first conductive layer composed of Au is disposed adjacent to $LiNbO_3$, which is a first medium, and a second conductive layer composed of Al is disposed adjacent to $SiO_2$.

FIG. 10 is a graph that schematically shows a displacement distribution of boundary acoustic waves (U1=longitudinal wave component, U2=SH wave component, and U3=SV wave component, wherein U1 to U3 are partial wave components constituting the boundary acoustic waves) in the case where Al thickness=0 in FIGS. 4 to 6. FIG. 11 is a graph that schematically shows a displacement distribution of boundary acoustic waves (U1=longitudinal wave component, U2=SH wave component, and U3=SV wave component, wherein U1 to U3 are partial wave components constituting the boundary acoustic waves) in the case where Al thickness=0.1λ in FIGS. 4 to 6.

As is apparent from FIGS. 10 and 11, in the boundary acoustic wave device 10 of the above embodiment including the IDT 13 prepared by laminating the first conductive layer 16 and the second conductive layer 17, the vibrational energy of boundary acoustic waves is concentrated in the vicinity of the IDT to the extent that is the same as that in a corresponding boundary acoustic wave device including the conventional IDT composed of only Au. Accordingly, in the case of the electrode structure in which Au, which is a conductor having a high density, and Al, which is a conductor having a low density, are laminated, the presence of the conductive layer 16 having a high density can effectively concentrate the energy of boundary acoustic waves on the boundary surface between the media.

In FIGS. 10 and 11, the density of the first medium is 4,640 kg/m$^3$, and the density of the second medium is 2,210 kg/m$^3$. The vibrational energy of boundary acoustic waves is proportional to $\rho U^2$ wherein ρ represents the density of the medium and U represents the amplitude. Accordingly, E1'/E2' determined from FIG. 10 is about 1.1.

As is apparent from FIG. 11, since the first conductive layer 16 composed of Au having a high density is disposed at the side of the first medium 11, which is a piezoelectric material, the center of the distribution of the vibrational energy of boundary acoustic waves is disposed at the side of the first medium 11. Accordingly, since the vibrational energy is strongly distributed at the side of the first medium 11, i.e., the side of the piezoelectric material, a high electromechanical coupling coefficient $K^2$ can be obtained.

In addition, E1/E2 determined from FIG. 11 is about 3.6. Accordingly, the relationship E1/E2>E1'/E2' is satisfied.

As described above, when a plane that separates the IDT 13 into two equal parts in the thickness direction is defined as a boundary plane, the energy of boundary acoustic waves that is present at the first medium 11 side of the boundary plane is represented by E1, and the energy of boundary acoustic waves that is present at the second medium side 12 from the boundary plane is represented by E2, the relationship E1/E2>E1'/E2' is satisfied. In this case, a higher electromechanical coupling coefficient $K^2$ can be obtained compared with the case where boundary acoustic waves are formed with a single-layered IDT electrode.

Figure 12:
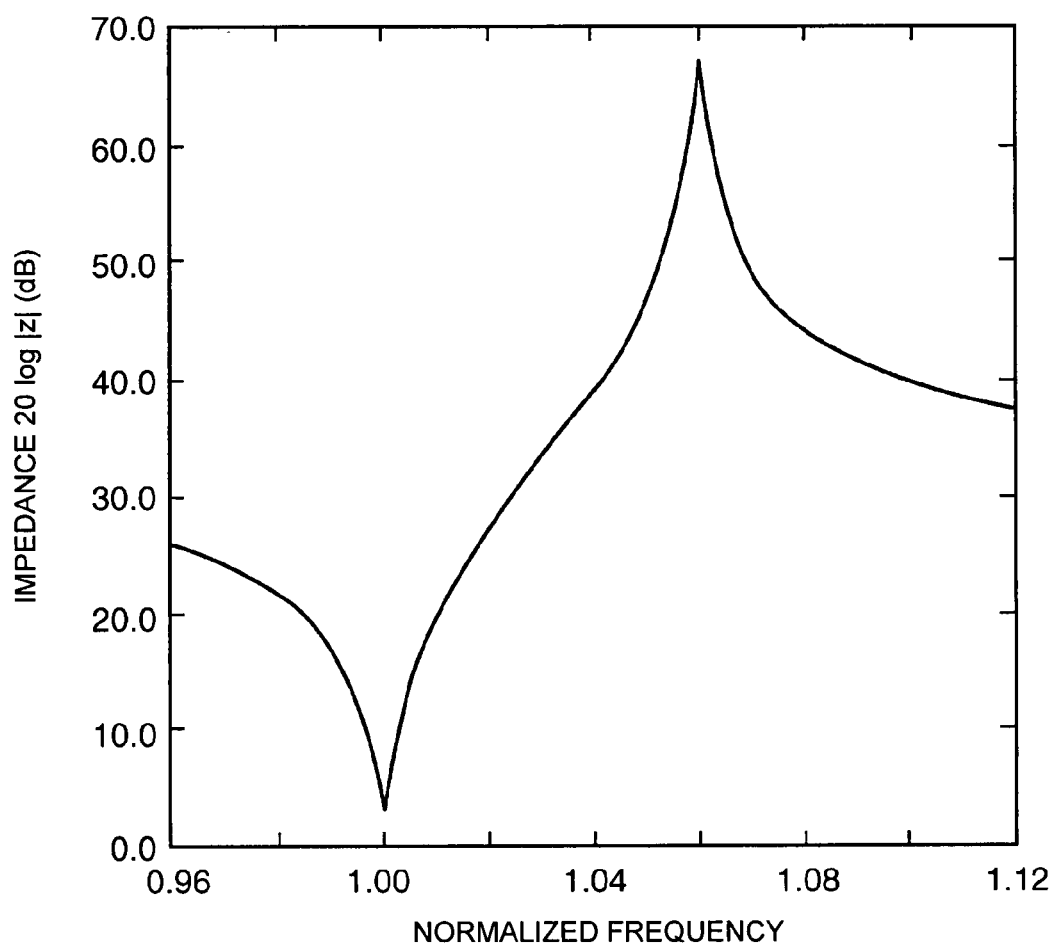
FIG. 12 is a graph showing a resonance characteristic of a boundary acoustic wave device according to an embodiment of the present invention.

FIG. 12 shows a specific resonance characteristic of a boundary acoustic wave resonator serving as the boundary acoustic wave device 10 shown in FIGS. 1 and 2. The resonance characteristic shown in FIG. 12 was determined from the boundary acoustic wave device 10 prepared under the following conditions.

First medium 11: 15° Y-cut X-propagation LiNbO$_3$ substrate with a thickness of 370 μm Second medium 12: SiO$_2$ with a thickness of 6 μm IDT 13: A structure in which layers composed of Al/Cu/Ti/Au/NiCr were laminated so as to have thicknesses of 50/10/70/3 nm was used. Aluminum (Al) was disposed so as to be adjacent to the second medium, and NiCr was disposed so as to be adjacent to the first medium 11. Titanium (Ti) was provided as a layer for increasing the adhesive strength between the conductive layers. The NiCr layer was provided as an adhesive layer for increasing the adhesiveness of Au to the first medium 11.

The number of pairs of electrode fingers of the IDT 13 was 60, the crossing width of the electrode fingers was 30λ, and the aperture width thereof was 30.4λ.

The number of electrode fingers of the reflectors 14 and 15 was 51.

Furthermore, in the IDT 13, a cross width weighting was applied so that the cross width at the center of the propagating direction of boundary acoustic waves was 30λ, and the cross width at both ends of the propagating direction of boundary acoustic waves was 15λ.

The period λ of the IDT 13 and the reflectors 14 and 15 was 1.6 μm. The electrode finger pitch of the IDT 13 and the reflectors 14 and 15 was 0.8 μm. The width of the electrode finger was 0.4 μm, and the width of the space between electrode fingers was 0.4 μm. Accordingly, the electrode finger pitch was determined to 0.8 μm as described above.

FIG. 12 shows an impedance/frequency characteristic of the boundary acoustic wave resonator serving as the above-described boundary acoustic wave device 10.

When an IDT composed of Al/Cu/Ti/Au/NiCr was used, the resonant resistance was decreased from 1.8 Ω to 1.4 Ω compared with that of an IDT composed of a Au layer and a NiCr adhesive layer.

By the above change in the electrode structure, the series resistance of the electrode fingers could be decreased by 19.4%.

The present invention is not limited to the boundary acoustic wave device 10 serving as the above-described boundary acoustic wave resonator, and can be applied to resonators and filters having various structures. More specifically, the present invention can also be widely used for various filters and switches using boundary acoustic waves, for example, a ladder-type filter, a longitudinally coupled resonator filter, a transversely coupled resonator filter, a transversal filter, a boundary acoustic wave optical switch, and a boundary acoustic wave optical filter.

The electrode material is not limited to Au and Al. Other conductive materials such as Pt, Ag, Cu, Ni, Ti, Fe, W, and Ta may also be used. Alternatively, alloys that mainly contain these conductive materials may also be used.

When the IDT is configured so as to have a laminated structure including a first conductive layer and a second conductive layer, the first conductive layer is composed of a metal having a relatively high density in the range of 7,000 to 20,000 kg/m$^3$, such as Au, and the second conductive layer is composed of a metal having a relatively low density of 1,740 kg/m$^3$ or more and less than 7,000 kg/m$^3$, such as Al. The metals constituting individual conductive layers in the laminated structure including the first conductive layer and the second conductive layer are not limited as long as the requirement for the densities of the metals constituting the first conductive layer and the second conductive layer is met.

Furthermore, in order to improve the adhesiveness and the electric power resistance, a thin layer composed of Ti, Cr, NiCr, Ni, or ZnO may be added to the first conductive layer and the second conductive layer. In this case, the thin layer may be provided between the first or second conductive layer and the first or second medium layer, or between the first conductive layer and the second conductive layer. It is sufficient that the thin layer has an effect of improving adhesiveness and an effect of preventing diffusion. Therefore, the thickness of the thin layer is in the range of about 1 to 30 nm.

In the present invention, in addition to the first conductive layer and the second conductive layer, at least one conductive layer including a third conductive layer may be further laminated. In such a case, the third conductive layer may be composed of the same material as that of either the first conductive layer or the second conductive layer or a different material. Accordingly, for example, an electrode structure composed of Al/Au/Al may be used. In this case, because of the presence of the Au layer, the electromechanical coupling coefficient $K^2$ can be moderately increased, the temperature coefficient of delay time TCD can be decreased to a certain degree, and a boundary acoustic wave device having a low conductor resistance of electrode fingers can be obtained.

The first medium 11 and the second medium 12 are laminated, but at least one medium may be further laminated. When the other medium is laminated on the first medium 11 or the second medium 12, the third medium may be disposed between the first medium and the second medium. In this case, when the first conductive layer composed of an electrode material having the relatively highest density is disposed adjacent to the medium that has a negative TCD, such as SiO$_2$, the TCD can be decreased. On the other hand, when the first conductive layer having a high density is disposed adjacent to the first medium composed of a piezoelectric material, the electromechanical coupling coefficient $K^2$ can be increased.

In the present invention, the IDT can be adjusted prior to the formation of the second medium by a method such as reverse sputtering, ion beam milling, reactive ion etching, or wet etching to adjust the frequency. Furthermore, when a laminated structure composed of second medium/third medium/IDT/first medium is used, the frequency can be adjusted by adjusting the thickness of the third medium by ion beam milling, etching, or the like or by additionally forming the third medium by a deposition method such as sputtering or evaporation.

The first medium and the second medium can be composed of various materials. Examples of the materials include Si, glass, SiO$_2$, SiC, ZnO, Ta$_2$O$_5$, PZT, AlN, Al$_2$O$_3$, LiTaO$_3$, LiNbO$_3$, and potassium niobate (KN). In particular, when a piezoelectric material is used as the first medium 11, in addition to LiNb$_2$O$_3$ described above, the above various piezoelectric materials such as ZnO, Ta$_2$O$_5$, PZT, and LiTaO$_3$ can also be used.

When a dielectric material is used as the second medium 12, such a material is not limited to SiO$_2$. Alternatively, glass, SiC, AlN, Al$_2$O$_3$, or the like may also be used. As described above, since piezoelectric materials generally have a positive TCD, dielectric materials having a negative TCD are preferably used as the material of the second medium 12 in order to decrease the TCD. Examples of such dielectric materials having a negative TCD include, in addition to SiO$_2$, quartz crystal, lithium tetraborate (LBO), langasite, langanite, and glass.

In the present invention, in order to increase the strength or to prevent a corrosive gas from intruding, a protective layer may be formed on the outside of a laminate. The laminate includes a first medium and a second medium or further a third medium. The material of the protective layer is not particularly limited. A protective layer composed of various types of material such as a polyimide; an epoxy resin; an inorganic insulating material, e.g., titanium oxide, aluminum nitride, or aluminum oxide; or a metal, e.g., Au, Al, or W may be used. The boundary acoustic wave device may be included in a package after the formation of the above protective layer or without forming the protective layer.

The invention claimed is:

1. A boundary acoustic wave device comprising:
   a first medium;
   a second medium laminated on the first medium; and
   an interdigital transducer disposed between the first medium and the second medium, the interdigital transducer including a plurality of laminated conductive layers, wherein a boundary plane separates the interdigital transducer into two equal parts in a thickness direction such that E1/E2>E1'/E2', wherein E1 represents a first energy level of boundary acoustic waves at a first medium side of the boundary plane, E2 represents a second energy level of the boundary acoustic waves at a second medium side of the boundary plane, E1' represents a third energy level of the boundary acoustic waves at the first medium side of the boundary plane when the interdigital transducer is configured so that a first sound velocity of the boundary acoustic waves when the interdigital transducer includes the plurality of conductive layers is equal to a second sound velocity of the boundary acoustic waves when the interdigital transducer includes only a conductive layer having a highest density among the plurality of conductive layers, and E2' represents a fourth energy level of the boundary acoustic waves at the second medium side of the boundary plane when the interdigital transducer is configured so that the first sound velocity of the boundary acoustic waves when the interdigital transducer includes the plurality of conductive layers is equal to the second sound velocity of the boundary acoustic waves when the interdigital transducer includes only the conductive layer having the highest density among the plurality of conductive layers.

2. The boundary acoustic wave device according to claim 1 wherein the first medium comprises a piezoelectric material.

3. The boundary acoustic wave device according to claim 1 wherein the second medium comprises a dielectric material.

4. The boundary acoustic wave device according to claim 1 wherein the interdigital transducer has a laminated structure including a first conductive layer composed of a first metal having a density in the range of about 7,000 to about 20,000 kg/m$^3$ and a second conductive layer composed of a second metal having a density of about 1,740 kg/m$^3$ or more and less than about 7,000 kg/m$^3$.

5. The boundary acoustic wave device according to claim 4, wherein the first metal is a metal selected from the group consisting of Pt, Au, Cu, Ag, Ni, Fe, W, Ta, Cr, and alloys thereof.

6. The boundary acoustic wave device according to claim 4, wherein the second metal is a metal selected from the group consisting of Mg, Al, Ti, and alloys thereof.

7. The boundary acoustic wave device according to claim 4, wherein the first conductive layer of the interdigital transducer is disposed adjacent to the first medium.

8. The boundary acoustic wave device according to claim 4, wherein when a thickness of the first conductive layer is represented by H, an electrode finger period of the interdigital transducer is represented by $\lambda$, and the relationship $0.025\lambda < H < 0.1\lambda$ is satisfied.

9. The boundary acoustic wave device according to claim 1 wherein an adhesive layer is provided in at least one of an area where the interdigital transducer is in contact with the first medium and an area where the interdigital transducer is in contact with the second medium.

10. The boundary acoustic wave device according to claim 1 further comprising a reflector disposed between the first medium and the second medium.

11. The boundary acoustic wave device according to claim 10, wherein the reflector comprises substantially the same material as the interdigital transducer.

12. A boundary acoustic wave device comprising:
a first medium;
a second medium laminated on the first medium; and
an interdigital transducer disposed between the first medium and the second medium,
wherein the interdigital transducer has a laminated structure including:
a first conductive layer composed of a first metal having a density in the range of about 7,000 to about 21,000 kg/m$^3$ and
a second conductive layer composed of a second metal having a density of about 1,740 kg/m$^3$ or more and less than about 7,000 kg/m$^3$,
the first conductive layer of the interdigital transducer disposed adjacent to the first medium, and
wherein, a thickness of the first conductive layer is represented by H, an electrode finger period of the interdigital transducer is represented by $\lambda$, and a relationship $0.025\lambda < H < 0.1\lambda$ is satisfied.

13. The boundary acoustic wave device according to claim 12, wherein the first medium comprises a piezoelectric material.

14. The boundary acoustic wave device according to claim 12, wherein the second medium comprises a nonconductive material.

15. The boundary acoustic wave device according to claim 12, wherein an adhesive layer is provided in at least one of an area where the interdigital transducer is in contact with the first medium and an area where the interdigital transducer is in contact with the second medium.

16. The boundary acoustic wave device according to claim 12, wherein the first metal is a metal selected from the group consisting of Pt, Au, Cu, Ag, Ni, Fe, W, Ta, Cr, and alloys thereof.

17. The boundary acoustic wave device according to claim 12, wherein the second metal is a metal selected from the group consisting of Mg, Al, Ti, and alloys thereof.

18. The boundary acoustic wave device according to claim 12, further comprising a reflector disposed between the first medium and the second medium.

19. The boundary acoustic wave device according to claim 18, wherein the
reflector comprises substantially the same material as the interdigital transducer.

* * * * *